United States Patent [19]

Law

[11] Patent Number: 4,577,190
[45] Date of Patent: Mar. 18, 1986

[54] PROGRAMMED LOGIC ARRAY WITH AUXILIARY PULL-UP MEANS TO INCREASE PRECHARGING SPEED

[75] Inventor: Hung-Fai S. Law, Summit, N.J.

[73] Assignee: AT&T Bell Laboratories, Murray Hill, N.J.

[21] Appl. No.: 483,645

[22] Filed: Apr. 11, 1983

[51] Int. Cl.[4] ..................... H03K 19/173; G06F 7/38
[52] U.S. Cl. .......................... 340/825.83; 340/825.91; 307/465; 307/468; 365/203
[58] Field of Search ...................... 340/825.83, 825.86, 340/825.87, 825.91; 307/465, 468; 364/716; 365/203, 226

[56] References Cited

U.S. PATENT DOCUMENTS 3,974,366 8/1976 Hebenstreit ..................... 340/825.87
4,037,089 7/1977 Horninger ..................... 340/825.83

OTHER PUBLICATIONS

IEEE Journal of Solid State Circuits, vol. SC-11, "High-Speed Programmable Logic Arrays in ESFI SOS Technology," 1976, pp. 370-374, by E. Hebenstreit et al.

Primary Examiner—Donald J. Yusko
Assistant Examiner—Sharon L. Hodgkins
Attorney, Agent, or Firm—David I. Caplan

[57] ABSTRACT

In a programmed logic array (PLA) having a crosspoint AND plane and a crosspoint OR plane, each of these planes has input lines and output lines intersecting at crosspoints across each of which a transistor driver is connected or not, depending upon the details of the desired logic transformation function of the plane. Each output line is connected to a separate clocked pull-up (or precharge) transistor for precharging that line, and the source terminal of each driver is connected to a clocked pull-down transistor for logic evaluation or computation. In order to reduce the time needed for precharging, the source terminal of every driver is connected to another clocked pull-up transistor.

10 Claims, 1 Drawing Figure

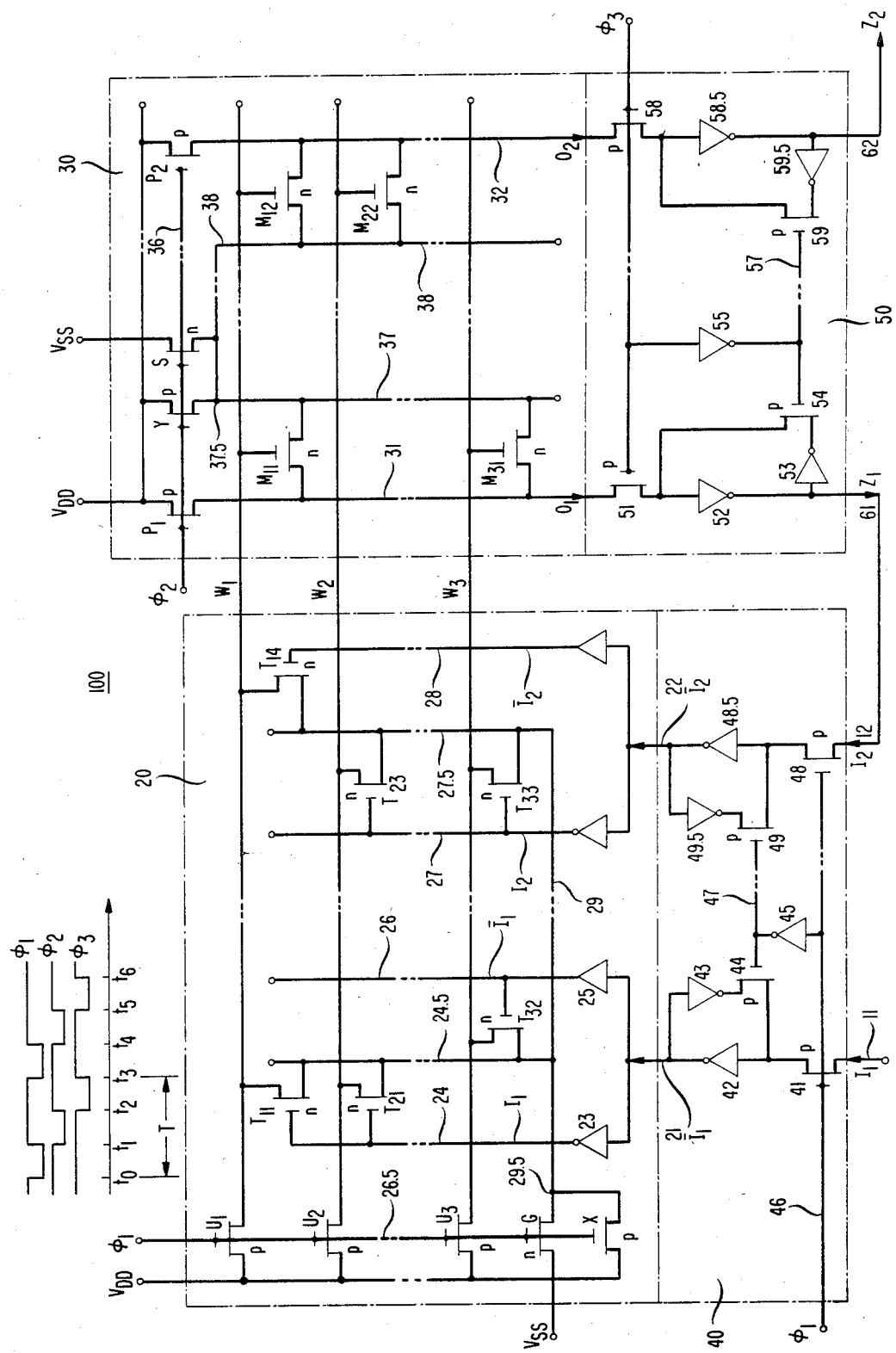

PROGRAMMED LOGIC ARRAY WITH AUXILIARY PULL-UP MEANS TO INCREASE PRECHARGING SPEED

FIELD OF THE INVENTION

This invention relates to data processing systems and more particularly to such systems which include programmed logic arrays (PLAs).

BACKGROUND OF THE INVENTION

Programmed logic arrays (PLAs) are used in the control units of microprocessors in data processing systems. A microprocessor can be viewed as the brains of a data processing system or computer. A PLA is a crosspoint array of transistors arranged to perform logic computations or transformations—that is, to process data by delivering data signal outputs as determined by data signal inputs in accordance with prescribed logic transformation rules, such rules typically involving AND, OR, and NOR logic operations to be performed upon the data inputs. In turn, the transformation rules are determined by the configuration of the array of transistors in the PLA, as more fully described below.

A PLA typically comprises two main portions known as the AND plane and the OR plane, respectively. Outputs of the AND plane are inputs to the OR plane. Each plane is in the form of a crosspoint logic array, i.e., a rectangular array of parallel row lines and parallel column lines intersecting at crosspoints. At each of selected crosspoints is located and connected a crosspoint driver transistor, the selection of such crosspoints depending upon and in accordance with the desired logic transformation rule to be implemented by the plane. Basically, each plane operates in a similar way in order to perform the NOR logic function transformation upon binary digital data (1's and 0's, corresponding to high and low voltage levels, respectively) entering the plane.

The specifics of the NOR functions implemented by the AND and OR planes are determined by the configurations in the respective planes of the selected crosspoints, i.e., the configurations formed by presences vs. absences of driver transistors connected at the various crosspoints. More specifically, input data to a given plane is applied along parallel (either row or column) input lines (wires) to the gate electrodes of the crosspoint driver transistors in the logic array of that plane, and output data from the plane emanates along parallel (column or row) output lines orthogonal to the input lines. Each such output line is connected to a ground node via the mutually parallel source-drain (high current-carrying) paths of all driver transistors located at crosspoints on that output line.

Each output line of the AND plane is also called a "wordline" and serves as an input line of the OR plane. Typically the crosspoint driver transistors are all MOS-FETs (Metal Oxide Semiconductor Field Effect Transistors). Each MOSFET has a pair of controlled source and drain or high-current-carrying terminals as well as a gate electrode control or low-current-carrying terminal.

A useful mode of operation of an AND plane (and similarly of an OR plane) involves clocked PMOS (p-channel MOS) load or pull-up transistors—in order to precharge to a high voltage level (essentially $V_{DD}$) each of the output lines of the AND plane during each precharge phase—in combination with NMOS (n-channel MOS) crosspoint driver transistors, and a clocked ground switch or pull-down transistor—in order to discharge the output lines to a low voltage level (essentially $V_{SS}$) during each evaluation or logic computation phase. Each clock cycle commences with a precharge phase of the AND plane. This precharge phase is typically immediately followed by a precharge phase of the OR plane—during which the AND plane evaluates the logic for that cycle. Thus, the precharge phase of the OR plane is the evaluation phase of the AND plane.

During each precharge phase of a given plane, all pull-up transistors in that plane are on while the pull-down transistor is off, in order to ensure precharging of all output lines of that plane to the high level regardless of the on vs. off conditions of the various (crosspoint) driver transistors. At the end of the precharge phase, or a very short time thereafter, the logic evaluation (or computation) phase begins. During the evaluation phase, the pull-up transistors are all off and the pull-down transistor is on. Thereby each output line either is pulled down to a low (or ground) level or remains at the high level, depending upon whether or not at least one driver on that output line is on. In any event, if at least one driver on a particular output line is on during evaluation, then that output line discharges via the driver and the pull-down transistor to ground.

A PLA that operates in the above-described manner has been disclosed, for example, by E. Hebenstreit et al in a paper entitled "High-Speed Programmable Logic Arrays in ESFI SOS Technology," published in *IEEE Journal of Solid State Circuits*, Vol. SC-11, pp. 370–374 (1976) at p. 371 (FIG. 3 therein).

The speed of operation of a PLA depends upon, among other things, the time it takes to ensure that the output lines of the AND plane and of the OR plane are properly precharged to the high level during the corresponding precharge phase: the longer the required precharge phase, the lower the speed of operation.

Since the slowest operating portion of a microprocessor is ordinarily the PLA, and since the lengths (durations) of all phases of each clock cycle are ordinarily made the same, it is important for high operating speed that the required time or phase duration for each phase be kept as small as feasible. Of all phases in a PLA, the precharge phase tends to be the longest. Therefore, it would be desirable to find a way to reduce the required duration of the precharge phase of the plane in a PLA.

SUMMARY OF THE INVENTION

This invention is based upon the discovery that the length of the precharge phase of an OR plane or of an AND plane (or both) can be reduced, and hence the speed of operation of a PLA can be increased, by adding a clocked ground node charging means or auxiliary pull-up transistor whose source-drain path is connected between the source of the high level ($V_{DD}$) and the ground node of the OR plane or of the AND plane (or of both). Accordingly, the invention is for a PLA comprising a plane (e.g., 30) including: (a) a first output line (e.g., 31) to which a high current-carrying terminal of each of a first plurality of driver transistors (e.g., $M_{11}$, $M_{31}$) is connected; (b) a clocked ground node (e.g., 37.5) to which another high current-carrying terminal of each of the first plurality of driver transistors ($M_{11}$, $M_{31}$) is connected; (c) clocked precharging means (e.g., $P_1$) connected to the first output line (31) for periodically charging the line essentially to a first predetermined voltage level (e.g., $V_{DD}$); (d) clocked ground node charging means (e.g., Y) connected to the ground node (37.5) for periodically charging the node essentially to the first predetermined level ($V_{DD}$).

The reason that the added clocked ground node charging means (auxiliary pull-up transistor) can increase the operating speed is most easily seen in conjunction with the details of operation of the OR plane. In the OR plane at the commencement of its precharge phase (when the OR plane pull-up transistors are on, and its pull-down transistor is off), all input lines are high, because then the precharge phase of the AND plane has just terminated. Consequently, all input lines of the OR plane—i.e., all the wordlines—commence the OR plane's precharge phase at the high level and remain at this high level until the signals propagating from the AND plane become valid later on during this precharge phase. Thus, during the early portion of the OR plane's precharge phase, until the signals from the AND plane become valid all the driver transistors ("drivers") in the OR plane are on, and therefore each of these drivers delivers current to its own source region capacitance, as well as to the drain region capacitance of the pull-down transistor (then off) and to the parasitic capacitances and resistances of the wiring interconnections between the driver itself and the pull-down transistor. Accordingly, the time constant associated with precharging the output lines of the OR plane is undesirably prolonged. This undesirable prolonging of precharge time constant is highlighted when all drivers on a given output line of the OR plane are turned off during later portions of a given precharge phase (and continuing through the OR plane's evaluation phase) as a result of signals arriving from the AND plane. At the commencement of this later portion of the OR plane's precharge phase when these signals first arrive at the OR plane's drivers, the given output line will not yet have been brought to its then desired high voltage level unless an undesirable further amount of time be devoted to the OR plane's precharge phase. In other words, much of the early portion of the OR plane's precharge time was wasted by undesirable diversion of precharging current to charging the parasitics (of source regions and wiring interconnections) instead of being fully utilized for precharging the OR plane's output lines. Addition of the auxiliary pull-up transistor in OR plane serves to aid in precharging the OR plane's output lines, by suppressing the undesirable diversion of precharging current, and thereby to reduce the required duration of the precharge phase.

BRIEF DESCRIPTION OF THE DRAWING

This invention—together with its features, advantages, and objects—can be better understood from the following detailed description when read in conjunction with the drawing in which the FIGURE is a circuit diagram of a PLA in accordance with a specific embodiment of the invention.

In the FIGURE, MOS transistors having p-type conductivity channels are indicated by the letter "p", and those having n-type conductivity channels by the letter "n". A timing diagram appears in the upper left-hand portion of the FIGURE, in order to help in understanding the invention.

DETAILED DESCRIPTION

As shown in the FIGURE, a PLA 100 comprises an AND plane 20, an OR plane 30, together with an input register 40, and an output register 50. It should be understood that the PLA 100 receives and delivers signals from and to other parts (not shown) of a data processing system in which the PLA is connected. The input register 40 comprises a linear array of clocked parallel latches including, illustratively, input lines 11 and 12 for introducing input data signals $I_1$ and $I_2$ into the AND plane 20. Typically each latch, for example, the one for input $I_1$ is formed by a clocked pass transistor 41 in series with an inverter 42. The other latch, for input $I_2$, includes another pass transistor 48. Further, in order to afford a latch for input $I_1$ which is static (i.e., a latch which does not lose the information stored therein if the clock sequence, described below, stops), a feedback loop is added comprising, for example, a feedback inverter 43 and a feedback transistor 44 as known in the art. The inverters 42 and 43 are cross-coupled (output of one is input of other), to form a flip-flop for storage of data when the feedback transistor 44 is on. In order to form a static latch for $I_2$, another feedback transistor 49 is added in conjunction with another pair of cross-coupled inverters 48.5 and 49.5. The gate electrode of the pass transistor 41 is clocked (timed) by a first clock pulse sequence $\phi_1$ delivered via a first interconnecting clock line 46, in order to turn on the transistor 41 during each first phase ($t_0 t_1$, $t_3 t_4$) of each clock cycle or period, of time duration T; whereas the gate electrode of the feedback transistor 44 is clocked by an interconnecting first complementary clock line 47 which supplies the complement of the first clock sequence $\phi_1$, in order to turn off the feedback transistor 44 during each such first phase. This complement of the first sequence is supplied from the sequence $\phi_1$ itself via the line 47 and an inverter 45 to the gate electrode of the feedback transistor 44.

Output of the latch for $I_1$ is delivered as complementary input $\bar{I}_1$ along an input line 21 to the AND plane 20. Similarly, the input register 40 contains other similarly constructed latches for delivering to the AND plane other inputs, such as the second complementary input signal $\bar{I}_2$ delivered on another input line 22. It should be understood that in general there can be, and ordinarily are, many more input lines and latches (not shown) for delivering many more inputs to the AND plane 20, as indicated in the FIGURE by the horizontal dotted line portions of the clock interconnecting lines 46 and 47 of the input register 40.

The AND plane 20 includes, for purposes of illustration and definiteness for a particular logic computation, crosspoint driver transistors $T_{11}$ and $T_{14}$ along the first (top) row or first wordline $W_1$, drivers $T_{21}$ and $T_{23}$ along the second row or second wordline $W_2$, and $T_{32}$ and $T_{33}$ along the third (bottom) row or third wordline $W_3$. A first column is defined by a first column line 24, a second column by a second column line 26, a third column by a third column line 27, and a fourth column by a fourth column line 28. The input $I_1$ is delivered to the first column 24 through a column line buffer inverter 23, and its complement $\bar{I}_1$, is delivered to the second column line 26 through a noninverting buffer 25. Similarly, the second input signal $I_2$ is delivered through a separate buffer inverter to the third column line 27, and its complement $\bar{I}_2$ through a noninverting buffer to the fourth column line 28. A high current-carrying drain (controlled) terminal of both of the drivers $T_{11}$ and $T_{14}$ is connected to the first wordline $W_1$; and the gate electrode (control terminal) of $T_{11}$ is connected to the first column line 24, of $T_{14}$ to the fourth column line 28. Again it should be understood that the AND plane 20 can have many more row and column lines, together with their crosspoints, as indicated by the dotted portions of the row lines and of column lines therein.

At the left-hand end of each wordline, $W_1$, $W_2$, $W_3$ is located a pull-up or precharge transistor, $U_1$, $U_2$, $U_3$. These precharge transistors $U_1$, $U_2$, $U_3$ all have their gate electrodes connected to an interconnecting clock line 26.5 so as to be clocked by the first clock sequence $\phi_1$. All the drain terminals of the crosspoint drivers in the AND plane 20 are thus brought essentially to voltage $V_{DD}$ during the low phases ($t_0t_1$, $t_3t_4$) of the first clock pulse sequence $\phi_1$, which then turns on the precharge transistors $U_1$, $U_2$, $U_3$. The sources of all three precharge transistors $U_1$, $U_2$, $U_3$ are connected to $V_{DD}$, their drains are all connected to wordlines $W_1$, $W_2$, and $W_3$, respectively. Each of the source terminals of these crosspoint drivers are connected to a ground node 29.5 via interconnecting wires 24.5, 27.5, and 29. The ground node 29.5 is connected through a ground switch (or "power switch") transistor G to voltage terminal $V_{SS}$ (ground). This ground switch transistor G has its gate electrode connected to the clock line 26.5, so as to be timed by the first clock sequence $\phi_1$. The ground node 29.5 can therefore be referred to as a "clocked ground node".

The ground switch G is an NMOS transistor, whereas the pull-up transistors $U_1$, $U_2$, and $U_3$ are all PMOS. Therefore, when G is on, $U_1$, $U_2$, and $U_3$ are all off, and when G is off, they are all on.

The AND plane 20 further includes, in accordance with a feature of the invention, an auxiliary clocked ground node pull-up transistor X whose drain is connected to (for controlling) the ground node 29.5 whose source is connected to $V_{DD}$, and whose gate electrode is connected to the first clock line 26.5 so that X is clocked by the first clock pulse sequence $\phi_1$.

The wordlines $W_1$, $W_2$, and $W_3$ conduct output signals from the AND plane 20 to supply input signals for the OR plane 30. This OR plane is constructed electrically similarly to the AND plane 20, with the function of rows and columns interchanged. Input signals to the OR plane arrive along row lines, $W_1$, $W_2$, $W_3$; first and second output signals $O_1$ and $O_2$ from the OR plane emanate along column output lines 31 and 32, respectively; and clock timing control for the OR plane is supplied by a second clock pulse sequence $\phi_2$ via a second clock line 36. This second sequence $\phi_2$ is advantageously nonoverlapping with respect to the first sequence $\phi_1$. Transistors $M_{11}$, $M_{12}$, $M_{22}$, and $M_{31}$ serve as crosspoint drivers for the OR plane 30; the transistors $P_1$ and $P_2$ serve as pull-up or precharge transistors; transistor S serves as a ground switch or power switch; and transistor Y serves as an auxiliary clocked ground node pull-up transistor for controlling a clocked ground node 37.5 of the OR plane 30, in accordance with a feature of the invention. This ground node 37.5 is directly connected, via interconnecting wires 37 and 38, to the sources of all crosspoint transistors in the OR plane.

As indicated by the dotted portions of the row wordlines $W_1$, $W_2$, $W_3$ and of the column output lines 31 and 32 the OR plane can include more than merely the three rows shown in the FIGURE and more than the two columns, as may be needed to implement desired logic computation.

The output lines 31 and 32 extend into the output register 50, in order to deliver thereto the first and second output signals $O_1$ and $O_2$, respectively. This output register is typically constructed similarly to the input register 40 and contains for output line 31, pass transistor 51, inverter 52, feedback inverter 53, and feedback transistor 54. An inverter 55 is also included to provide on line 57 a third complementary clock pulse sequence $\bar{\phi}_3$, i.e., a sequence complementary to $\phi_3$ which is nonoverlapping with both the first and second sequences $\phi_1$ and $\phi_2$. The elements 51 through 59 of the output register 50 are all similar to the elements 41 through 49, respectively, in the input register 40 except that the transistors 51 and 54 are timed by a third clock plus sequence $\phi_3$.

The third clock sequence $\phi_3$ turns on the pass transistor 51 in the output register 50 at timing $t_2$ and $t_5$, that is, just after the second clock sequence $\phi_2$ turns off the pass transistor 41 in the input register 40. By "just after" is meant immediately after except for a relatively small delay (not shown in the timing diagram) corresponding to the desired safety margin, if any is required, to avoid premature transmission (race-through) of data signals, as known and understood in the art. After inversion by the inverter 52 into complementary output signal $\bar{O}_1$, the output signal $\bar{O}_1$ on output line 31 thus exits from the output register 50 as output signal $Z_1$ ($=\bar{O}_1$) on a feedback line 61, so that the output signal $Z_1$ becomes the second input signal $I_2$ for the input register 40 on its input line 12 during the next succeeding cycle, that is, when the pass transistor 48 in the input register 40 turns on again. On the other hand, the second output signal $O_2$ on the output line 32, after passage through the output register 50, becomes another output signal $Z_2$ ($=\bar{O}_2$) available for other parts (not shown) of the data processing system.

During operation, data is allowed to enter as binary digital signals into the input register 40 through the pass transistors 41 and 48 during each first phase (e.g., $t_0t_1$, $t_3t_4$) of each clock cycle. These data are latched (stored) in this input register during the remaining second phase (e.g., $t_1t_2$, $t_4t_5$) and third phase (e.g., $t_2t_3$, $t_5t_6$) of the cycle, i.e., when the feedback transistors in this register are on. During each first phase, moreover, the precharge transistors $U_1$, $U_2$, $U_3$ in the AND plane 20 are on, as is the ground node pull-up transistor X, since $U_1$, $U_2$, $U_3$, and X are all clocked by the first sequence $\phi_1$. At the same time, the ground switch transistor G is off, because it is also clocked by $\phi_1$ but is an NMOS transistor. Accordingly, during each such first phase, the wordlines $W_1$, $W_2$, $W_3$ are precharged, essentially to the voltage level $V_{DD}$ ("high" voltage level), regardless of the on-off conditions of the crosspoint transistors because, for example, $U_1$, $T_{11}$, and G are connected mutually in series and G is off. At the same time, the ground node 29.5 is then likewise precharged essentially to $V_{DD}$ because the ground node pull-up transistor X is then on.

At the commencement (e.g., $t_1$, $t_4$) of each second phase (e.g., $t_1t_2$, $t_4t_5$), the precharge transistors $U_1$, $U_2$, $U_3$ turn off, as does the ground node pull-up transistor X, while the ground switch G turns on. Accordingly, each of the wordlines $W_1$, $W_2$, $W_3$ is or is not pulled down essentially to ground potential $V_{SS}$ ("low" voltage level) during the second and third phases (e.g., during $t_1t_3$, $t_4t_6$), depending upon whether or not any one of the AND plane crosspoint transistors connected to that wordline is then on, in turn as determined by the then latched logic values (1's or 0's) of the data in the input register 40. For example, if the value of the first input signal ($I_1$) on input line 11 is a 0, then the value of $\bar{I}_1$ on column line 26 is a 1, so that crosspoint transistor $T_{32}$ is on and hence the voltage level of the third wordline $W_3$ goes essentially to ground or $V_{SS}$ (regardless of the on-off condition of the other crosspoint transistor $T_{33}$ also connected to this third wordline $W_3$). Also during each second phase (e.g., $t_1t_2$, $t_4t_5$) of the clock cycle, the column output lines 31 and 32 of the AND plane 30 are precharged essentially to $V_{DD}$, since then the OR-plane precharge transistors $P_1$ and $P_2$ are on while the ground switch S is off, because of the second clock sequence $\phi_2$ supplied to $P_1$, $P_2$, and S through the clock line 36. At the same time, the OR plane's ground node pull-up transistor Y is on, whereby the voltage of ground node 31.5 is pulled up to a voltage level of essentially $V_{DD}$.

At the commencement of each third phase (e.g., at $t_2$, $t_5$) the OR plane's precharge transistors turn off, as does the ground node pull-up transistor Y, but the ground switch S turns on. Thereby during the third phase (e.g., $t_2t_3$, $t_5t_6$) each of the column output lines 31 and 32 remains essentially at $V_{DD}$ unless and until at least one of the crosspoint transistors connected to the respective column line is on, i.e., unless the corresponding wordline is high. For example, if the first wordline $W_1$ is high, then the voltage levels of both column lines 31 and 32 will be pulled down to ground by crosspoint transistors $M_{11}$ and $M_{12}$, respectively, regardless of the voltage level of other wordlines. On the other hand, if the second wordline $W_2$ is high while the first and third wordlines $W_1$ and $W_3$ are both low, then the crosspoint transistor driver $M_{22}$ is on and while the other OR plane drivers $M_{11}$, $M_{12}$, $M_{31}$, are off, and only the second column output line 32 is low, while the first column output line 31 remains essentially at the high, precharge level $V_{DD}$; i.e., the first output signal $O_1$ is a 1, and the second output signal $O_2$ is a 0.

During the third phases (e.g., $t_2t_3$, $t_5t_6$), the pass transistors 51 and 58 in the output register 50 are both on, the feedback transistors 54 and 59 are both off. Thus, the output register 50 can then receive data signals $O_1$ and $O_2$ from the OR plane 30 flowing on the output lines 31 and 32, and can then also deliver the corresponding data signals $Z_1$ and $Z_2$ along its output lines 61 and 62, respectively. The output signal $Z_1$ is simply $\bar{O}_1$ (the logical inverse of $O_1$); the output signal $Z_2$ is simply $\bar{O}_2$. The output signal $Z_1$ is fed back to become the input $I_2$ of the input register 40. The output signal $Z_2$ is delivered as input to other part(s) of the system. The output register is latched (because the feedback transistors 54 and 59 then turn on) as of the beginning (e.g., $t_3$) of the first phase (e.g, $t_3t_4$) of the immediately following cycle (e.g., $t_3t_6$), so that the outputs $Z_1$ and $Z_2$ remain stable throughout both the first and the second phases (e.g., $t_3t_5$) of the immediately following cycle (because the feedback transistors 54 and 59 then stay on).

In particular, the desirable feature of operation of the ground node pull-up transistor Y can be understood as follows. At the commencement $t_0$ of the cycle $t_0t_3$, the voltage at node 37.5 is essentially $V_{SS}$ owing to earlier operation during the immediately preceding cycle (when this node was pulled down to essentially $V_{SS}$ by the on condition of the ground switch S during the second and third phases of the immediately preceding cycle). At the commencement $t_1$ of the precharge phase $t_1t_2$ of the OR plane 30, all wordlines $W_1$, $W_2$, $W_3$ are high in the region of the OR plane, due to earlier precharge of the AND plane during the AND plane's immediately preceding precharge phase $t_0t_1$; and all these wordlines $W_1$, $W_2$, $W_3$ remain high unless and until low signals from the AND plane arrive (and remain valid) during a later portion of this precharging phase $t_1t_2$. Thus, in particular, throughout a beginning portion of the OR plane's precharge phase $t_1t_2$, the crosspoint driver transistors $M_{11}$ and $M_{31}$ connected to the output line 31 are both on. At the same time, the pull-up precharge transistor $P_1$ is on and attempts to precharge the output line 31 to the desired voltage level of essentially $V_{DD}$. This level of essentially $V_{DD}$ is desired in cases, for example, where during the immediately following evaluation phase $t_2t_3$ the signals on both wordline $W_1$ and $W_3$ are going to be low and hence drivers $M_{11}$ and $M_{31}$ are going to be off (while the ground switch transistor S is going to be on), and hence while the output line 31 is going to be desirably at the high precharge level of essentially $V_{DD}$. However, owing to the resistance of the pull-up transistor $P_1$, the capacitances of drivers $M_{11}$ and $M_{31}$ and of ground switch S, as well as the resistances and capacitances (to ground) of the wiring interconnections of these drivers $M_{11}$ and $M_{31}$ to the ground switch S, and because the voltage at ground node 37.5 at time $t_1$ is essentially $V_{SS}$ (ground), the output line 31 undesirably will not become precharged essentially to $V_{DD}$ during the precharge phase $t_1t_2$, but instead precharge current from the pull-up transistor $P_1$ is diverted to the ground node 37.5, so that the output line 31 relatively slowly precharges, from essentially $V_{SS}$ to an intermediate value between $V_{SS}$ and $V_{DD}$, unless the OR plane's precharge phase $t_1t_2$ is made undesirably long. Since ordinarily in data processing systems all phases are made equally long, the lengthening of $t_1t_2$ would desirably also entail lengthening of $t_0t_1$ and $t_2t_3$; that is, the cycle time $t_0t_3$ is undesirably lengthened further. On the other hand, the addition of the ground node pull-up transistor Y quickly precharges the ground node 37.5 essentially to the high level $V_{DD}$ during the initial portion of the OR plane's precharge phase $t_1t_2$, and thereby prevents diversion of precharge current from the output line 31 through the drivers to the ground node 37.5, and thereby enables faster precharge of the output line 31, and hence allows operation with a shorter duration of the precharge phase $t_1t_2$.

Although the invention has been described in detail in terms of a specific embodiment, various modifications can be made without departing from the scope of the invention. For example, it should be understood that either the added ground node pull-up transistor X in the AND plane 20 or the added ground node pull-up transistor Y in the OR plane 30 can be omitted in case the required precharge time caused by the precharging of parasitics is not a problem in that plane. Moreover, the latches in the registers 40 and 50 can be clocked CMOS (complementary MOS) rather than the clocked PMOS (p-channel MOS).

What is claimed is:

1. A logic array including a PLA comprising a plane having:
   (a) a first output line to which a high current-carrying terminal of each of a first plurality of driver transistors is connected;

(b) a clocked ground node to which another high current-carrying terminal of each of the first plurality of driver transistors ($M_{11}$, $M_{31}$) is connected;

(c) clocked precharging means connected to the first output line (31) for charging the line essentially to a first predetermined voltage level during only a predetermined portion of each cycle of a clock sequence;

(d) clocked ground node charging means connected to the ground node (37.5) for charging the node essentially to the first predetermined voltage level ($V_{DD}$) during only the predetermined portion ($t_1 t_2$) of each said cycle; and (e) power switching means connected to the clocked ground node (37.5) and for discharging the clocked ground node (37.5) essentially to a second, different predetermined voltage level during only a remaining portion of each said cycle.

2. The array of claim 1 in which the clocked precharging means ($P_1$) and the power switching means (S) each comprises a transistor of opposite type from the other.

3. The array of claim 2 in which a control terminal of the clocked precharging means ($P_1$), a control terminal of the power switching means (S), and a control terminal of the clocked ground node charging means (Y) are connected to a terminal for supplying the clock pulse sequence to each said control terminal.

4. The array of claim 3 in which all the driver transistors ($M_{11}$, $M_{31}$) are of the same type (NMOS) as that of the power switching means (S).

5. The array of claim 2 in which all the driver transistors ($M_{11}$, $M_{31}$) are of the same type (NMOS) as that of the power switching means (S).

6. A PLA having a plane comprising:
(a) a first output line;
(b) a ground node;
(c) a first plurality of driver transistors, each of the driver transistors having a first controlled terminal which is connected to the first output line (31) and each of the driver transistors having a second controlled terminal which is connected to the ground node;

(d) a first precharging transistor connected across a first voltage level terminal and the first output line (31), and clocked for charging the output line (31) essentially to a first predetermined voltage level during only a predetermined portion of each cycle of a clock sequence;

(e) a ground node charging transistor connected across the ground node (37.5) and the first level terminal, and clocked for charging the node essentially to the first level during only the predetermined portion of each said cycle;

(f) a power switching transistor connected across a second voltage level terminal and the ground node (37.5), and clocked for discharging the ground node (37.5) essentially to a second, different predetermined level during only a remaining portion of each said cycle.

7. The PLA of claim 6 in which the power switching transistor (S) and all the driver transistors ($M_{11}$, $M_{31}$) are NMOS transistors, and in which the first precharging transistor ($P_1$) and the ground node charging transistor (Y) are PMOS transistors.

8. The PLA of claim 6 further comprises a second output line, a second plurality of driver transistors a controlled terminal of each of which is connected to the second output line (32) and another controlled terminal of each of which is connected to the ground node (37.5), and a second precharging transistor connected across the second output line (32) and the first level terminal, and clocked for charging the second line essentially to the first level during only the predetermined portion of each said cycle.

9. The PLA of claim 8 in which the power switching transistor (S) and all the driver transistors ($M_{11}$, $M_{31}$, $M_{12}$, $M_{22}$) are NMOS, and in which the first and second precharging transistors ($P_1$ and $P_2$) and the ground node charging transistor (Y) are PMOS.

10. The PLA of claim 8 in which a gate electrode of the first precharging transistor ($P_1$), a gate electrode of the power switching transistor (S), and a gate electrode of the ground node charging transistor (Y) are connected to a terminal for supplying the clock sequence to each of said gate electrodes.

* * * * *